United States Patent
Yamamoto et al.

(10) Patent No.: US 9,984,177 B2
(45) Date of Patent: May 29, 2018

(54) MODELING DEVICE, THREE-DIMENSIONAL MODEL GENERATION DEVICE, MODELING METHOD, PROGRAM AND LAYOUT SIMULATOR

(71) Applicant: Panasonic Intellectual Property Management Co., Ltd., Osaka (JP)

(72) Inventors: Harumi Yamamoto, Osaka (JP); Hajime Jikihara, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 246 days.

(21) Appl. No.: 14/893,199

(22) PCT Filed: May 30, 2014

(86) PCT No.: PCT/JP2014/002895
§ 371 (c)(1),
(2) Date: Nov. 23, 2015

(87) PCT Pub. No.: WO2014/192316
PCT Pub. Date: Dec. 4, 2014

(65) Prior Publication Data
US 2016/0092608 A1    Mar. 31, 2016

(30) Foreign Application Priority Data
May 31, 2013    (JP) .................................. 2013-115400

(51) Int. Cl.
*G06T 17/00* (2006.01)
*G06F 17/50* (2006.01)
*G06K 9/00* (2006.01)

(52) U.S. Cl.
CPC .......... *G06F 17/5004* (2013.01); *G06T 17/00* (2013.01); *G06K 9/00201* (2013.01); *G06T 2210/04* (2013.01)

(58) Field of Classification Search
None
See application file for complete search history.

(56) References Cited

U.S. PATENT DOCUMENTS 5,742,294 A * 4/1998 Watanabe ............... G06T 15/00
   345/672
6,529,626 B1 * 3/2003 Watanabe ................. G06T 7/55
   345/427

(Continued)

FOREIGN PATENT DOCUMENTS

JP    61-175778 A    8/1986
JP    04-133184 A    5/1992

(Continued)

OTHER PUBLICATIONS

Chow, J. et al., "Point-based and plane-based deformation monitoring of indoor environments using terrestrial laser scanners", Journal of Applied Geodesy, vol. 6, No. 3-4, Nov. 1, 2012, pp. 193-202.

(Continued)

*Primary Examiner* — Said Broome
(74) *Attorney, Agent, or Firm* — McDermott Will & Emery LLP

(57) ABSTRACT

A modeling device obtains three-dimensional coordinates from a measurement device for taking three-dimensional measurements of the three-dimensional structure having faces to produce model information of the three-dimensional structure, and includes a face extractor, a vertex extractor and a model producer. The face extractor produces a plane equation describing a face based on coordinates of each measurement point of the face. The vertex extractor extracts (Continued)

a point simultaneously satisfying plane equations describing adjoining faces as a vertex shared among the faces. The model producer produces model information representing the three-dimensional structure based on plane equations and vertexes. The face extractor determines a plane equation by recalculation based on measurement points existing in a range of a prescribed distance from a plane candidate.

14 Claims, 5 Drawing Sheets

(56) References Cited

U.S. PATENT DOCUMENTS

| | | | |
|---|---|---|---|
| 2006/0061566 A1 | 3/2006 | Verma et al. | |
| 2006/0101055 A1* | 5/2006 | Valdiserri | G16H 10/60 |
| 2008/0253610 A1* | 10/2008 | Shimizu | G06K 9/00248 |
| | | | 382/103 |
| 2009/0040216 A1* | 2/2009 | Ishiyama | G06T 17/20 |
| | | | 345/419 |
| 2010/0053186 A1* | 3/2010 | DeRose | G06T 19/00 |
| | | | 345/581 |
| 2013/0121564 A1 | 5/2013 | Kitamura et al. | |

FOREIGN PATENT DOCUMENTS

| | | |
|---|---|---|
| JP | 2000-306111 A | 11/2000 |
| JP | 2003-156333 A | 5/2003 |
| JP | 2006-058244 A | 3/2006 |

OTHER PUBLICATIONS

Nasir, A. et al., "Plane Extraction and Map Building Using a Kinect Equipped Mobile Robot", Workshop on Robot Motion Planning: Online, Reactive, and in Real-time, 2012 IEEE/RJS International Conference on Intelligent, Robots and Systems, IROS 2012, Oct. 7, 2012.
Extended European Search Report issued in European Application No. 14804644.4 dated Jun. 24, 2016.
C. Wang et al., "Extraction of Polyhedral Description from Panoramic Range Data in Polar Coordinate System," IPSJ SIG Notes, vol. 2001, No. 23, Information Processing Society of Japan, Mar. 8, 2001, pp. 65-72, with English translation of abstract.
C. Wang et al., "Extracting Polyhedral Description from Range Data for Scene Understanding," The Institute of Electrical Engineers of Japan Kenkyukai Shiryo, IIS-00-22 to 27, The Institute of Electorical Engineers of Japan, Aug. 11, 2000, pp. 13-18, with English translation of abstract.
International Search Report issued in International Application No. PCT/JP2014/002895 dated Aug. 19, 2014, with English translation.

* cited by examiner

MODELING DEVICE, THREE-DIMENSIONAL MODEL GENERATION DEVICE, MODELING METHOD, PROGRAM AND LAYOUT SIMULATOR

RELATED APPLICATIONS

This application is the U.S. National Phase under 35 U.S.C. § 371 of International Application No. PCT/JP2014/002895, filed on May 30, 2014, which in turn claims the benefit of Japanese Application No. 2013-115400, filed on May 31, 2013, the disclosures of which are incorporated by reference herein.

TECHNICAL FIELD

The invention relates to a modeling device configured to produce a model of three-dimensional structure based on measurement results by three-dimensional measurements of the three-dimensional structure. The invention further relates to a three-dimensional model generation device configured to produce a model of three-dimensional structure in a real space, a modeling method for producing a model of three-dimensional structure, a program for realizing the modeling device, and a layout simulator with the modeling device.

BACKGROUND ART

Technology for producing a three-dimensional model in a target space has been so far proposed by Document 1 (JP Pub. No. 1992-133184), for example. The technology described in Document 1 projects lattice light on a target space to capture a projection image, thereby finding a position and an inclination of each plane based on positional relation of intersection points of a lattice in the projection image.

In Document 1, structure lines in a room is calculated by classifying each adjacent relation of planes into a fold, a ramp boundary or in-plane boundary based on positions and inclinations of planes and then calculating plane boundaries to obtain intersection lines. That is, a configuration described in Document 1 extracts folds, ramp boundaries and in-plane boundaries in order to extract structure lines in the room including objects disposed in the target space.

Document 1 also describes restoration of structure lines, which are obstructed by a small object(s) and cannot be detected from the image for extracting the structure lines in this way.

Measurements may require removing an interior object(s) when interior wallpapers are changed to new ones or when heat insulators are installed.

Document 1 discloses that structure lines can be stably restored even when a region lacks part thereof owing to noise, a small obstacle(s) or the like. The technology described in Document 1 cannot however produce a model of three-dimensional structure after an interior object(s) is(are) removed in order to change interior wallpapers or install heat insulators because the technology described in Document 1 extracts a large object such as a desk as a component of a three-dimensional model.

SUMMARY OF INVENTION

It is an object of the present invention to provide a modeling device capable of producing a model of three-dimensional structure even when there is a region which cannot be measured by a measurement device as a result of part of the three-dimensional structure being obstructed by a comparatively large object. It is a further object of the present invention to provide a three-dimensional model generation device configured to produce a model of three-dimensional structure in a real space, a modeling method for producing a model of three-dimensional structure, a program for realizing the modeling device, and a layout simulator with the modeling device.

A modeling device according to the present invention includes a receiver, a face extractor, a vertex extractor and a model producer. The receiver is configured to obtain, as first data, three-dimensional coordinates of each of measurement points of three-dimensional structure having a plurality of faces from a measurement device configured to take three-dimensional measurements of the three-dimensional structure. The face extractor is configured to produce, for each of the plurality of faces, a plane equation describing a face based on first data of each of measurement points of the face. The vertex extractor is configured to calculate, every adjoining faces of the plurality of faces, a point that simultaneously satisfies respective plane equations describing adjoining faces to extract the point as a vertex shared among the adjoining faces. The model producer is configured to produce model information representing the three-dimensional structure based on each plane equation and each vertex. The face extractor is configured to define, as a plane candidate, a plane described by a plane equation obtained based on coordinates of each of three measurement points of one face, and to determine a plane equation by recalculation based on measurement points existing in a range of a prescribed distance from the plane candidate.

A three-dimensional model generation device according to the present invention includes the modeling device and the measurement device.

A modeling method according to the present invention includes: obtaining, as first data, three-dimensional coordinates of each of measurement points of three-dimensional structure having a plurality of faces through a receiver from a measurement device configured to take three-dimensional measurements of the three-dimensional structure; producing, for each of the plurality of faces, a plane equation describing a face based on first data of each of measurement points of the face through a face extractor; calculating, every adjoining faces of the plurality of faces, a point that simultaneously satisfies respective plane equations describing adjoining faces to extract the point as a vertex shared among the adjoining faces; and producing model information representing the three-dimensional structure based on each plane equation and each vertex through a model producer, wherein the face extractor defines, a plane candidate, a plane described by a plane equation obtained based on coordinates of each of three measurement points of one face, and determines a plane equation by recalculation based on measurement points existing in a range of a prescribed distance from the plane candidate.

A program according to the present invention allows a computer to function as a modeling device. The modeling device includes a receiver, a face extractor, a vertex extractor and a model producer. The receiver is configured to obtain, as first data, three-dimensional coordinates of each of measurement points of three-dimensional structure having a plurality of faces from a measurement device configured to take three-dimensional measurements of the three-dimensional structure. The face extractor is configured to produce, for each of the plurality of faces, a plane equation describing a face based on first data of each of measurement points of the face. The vertex extractor is configured to calculate, every adjoining faces of the plurality of faces, a point that simultaneously satisfies respective plane equations describing adjoining faces to extract the point as a vertex shared among the adjoining faces. The model producer is configured to produce model information representing the three-dimensional structure based on each plane equation and each vertex. The face extractor is configured to define, a plane candidate, a plane described by a plane equation obtained based on coordinates of each of three measurement points of one face, and to determine a plane equation by recalculation based on measurement points existing in a range of a prescribed distance from the plane candidate.

A layout simulator according to the present invention includes a display controller, an article positioning module, a texture provider and an attribute adjuster. The display controller is configured to allow a monitor device to display, on a screen of the monitor device, a virtual space of three-dimensional structure by computer graphics based on the model information produced by the modeling device. The article positioning module is configured to position a three-dimensional article having three-dimensional information in a place of the virtual space. The texture provider is configured to give texture information to a face in the virtual space. The attribute adjuster is configured to adjust an attribute containing positions of the article and the texture.

The configuration of the invention obtains three-dimensional coordinates of each of measurement points of three-dimensional structure having the plurality of faces, and generates a plane equation every face based on each coordinates, and extracts every adjoining faces of the plurality of faces a vertex shared among them, and produces a model as a set of boundary lines each of which connects vertexes. Therefore, even if part of the three-dimensional structure is obstructed by a comparatively large object and cannot be measured by the measurement device, a position of a vertex is estimated by calculation of plane equations. As a result, it is possible to produce a model of the three-dimensional structure in which a region that cannot be measured is compensated. After a plane candidate is defined, a plane equation is determined by recalculation based on measurement points existing in the range of the prescribed distance from the plane candidate. It is accordingly possible to realize high-precision model reproducibility with respect to a shape of the three-dimensional structure.

DESCRIPTION OF EMBODIMENTS

Figure 1:
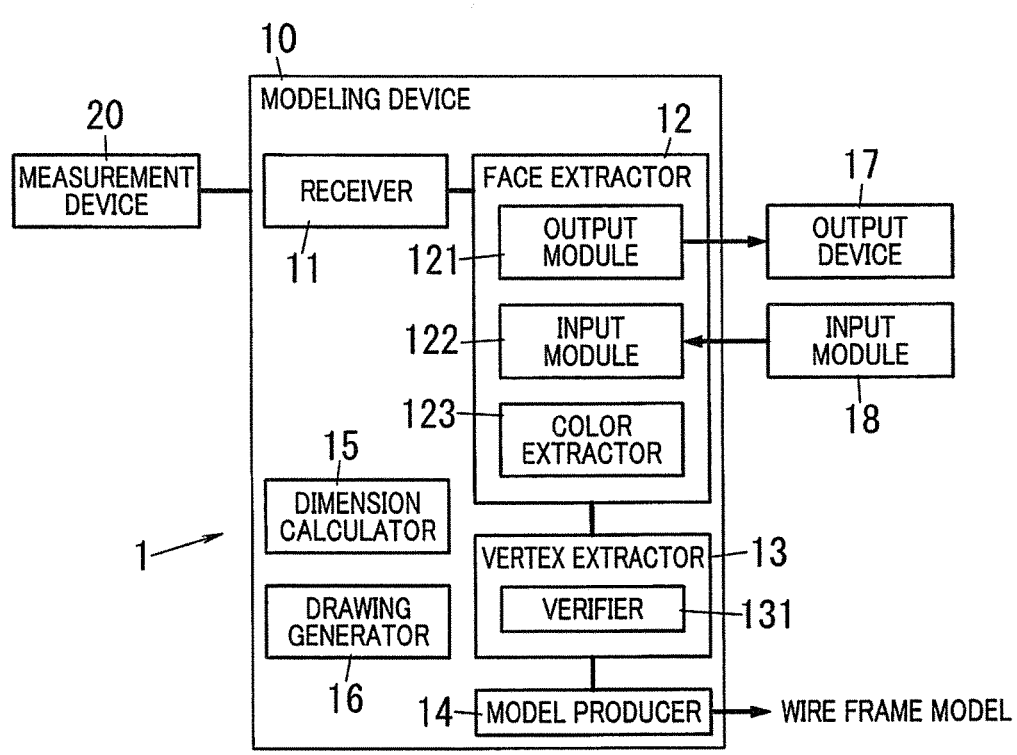
FIG. 1 is a block diagram showing an embodiment.

As shown in FIG. 1, a three-dimensional model generation device 1 explained below includes a measurement device 20 configured to take three-dimensional measurements of three-dimensional structure 30 (see FIG. 2) having a plurality of faces 3 (see FIG. 2), and a modeling device 10 configured to produce information on a model of the three-dimensional structure 30.

Figure 3:
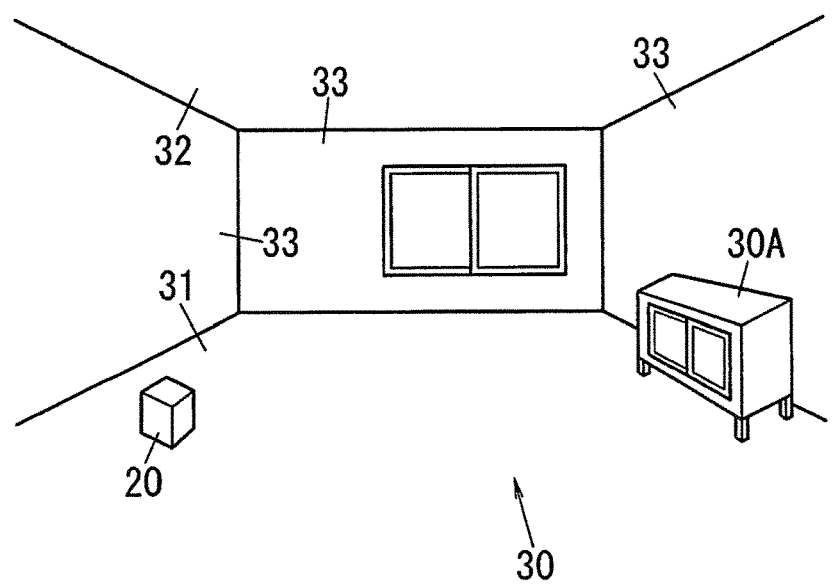
FIG. 3 is a perspective view of an example of three-dimensional structure as a measurement target in the embodiment.

In the embodiment, a room inside a building as shown in FIG. 3 is exemplified as the three-dimensional structure 30 having the plurality of faces 3. That is, the embodiment focuses on inner faces of the room. However, the three-dimensional structure 30 may be either an inside or an outside of the building. In addition, technology to be explained below can be applied to three-dimensional structure 30 except for a building.

In FIG. 1, the measurement device 20 configured to take three-dimensional measurements is what is called a 3D laser scanner. The 3D laser scanner is configured to three-dimensionally pass pulse laser beams over part to output three-dimensional coordinates of the part on which the pulse laser beams are focused. In order to obtain the three-dimensional coordinates, the measurement device 20 emits intensity-modulated light, of which intensity periodically changes over time, to receive reflected light from a space into which the intensity-modulated light is emitted. The measurement device 20 then detects a phase difference between the emitted intensity-modulated light and the received intensity-modulated light to obtain a flight time of the intensity-modulated light from the phase difference. Hereinafter, the pulse laser beams are simply referred to as "laser beams".

The 3D laser scanner in the embodiment includes a measurement module (not shown) configured to rotate in a plane parallel with an installation surface thereof. The measurement module is also configured to pass a laser beam(s) (scan) in a plane perpendicular to the installation surface every rotational position.

When the 3D laser scanner is installed on a floor, the 3D laser scanner emits laser beams in all ranges except for part of the floor while the measurement module is rotating in the plane parallel with the floor. Therefore, the laser beams are to be emitted in various directions around the measurement module as a center. That is, the laser beams are emitted three-dimensionally. However, a direction toward a member that supports the measurement module is excluded from emission directions of laser beams. The measurement module does not therefore emit laser beams inside the part of the floor on which the 3D laser scanner is installed.

The 3D laser scanner measures phase differences while respective laser beams are emitted and reflected by the three-dimensional structure 30 to return to the measurement device 20. The 3D laser scanner converts the measured phase differences into distances up to respective parts of the three-dimensional structure 30 as respective reflection points of the laser beams. The 3D laser scanner further identifies respective positions of the three-dimensional structure 30 as respective focused points of the laser beams based on the emission directions of laser beams and the distances up to respective reflection points of the laser beams. Each of the positions identified based on the emission directions of laser beams and the distances up to respective reflection points of the laser beams is represented by coordinates of a polar coordinate system (i.e., spherical coordinates).

The measurement device 20 outputs coordinates for each of the focused points of the laser beams. That is, coordinate points are discretely obtained from the three-dimensional structure 30. Hereinafter, each position determined by coordinates is also called a "measurement point". In addition, a collection of data on three-dimensional coordinate points to be output from the measurement device 20 is called a collection of first data. As stated above, the measurement device 20 emits a pulse laser beam to output three-dimensional coordinates of a measurement point that is part of the three-dimensional structure 30 as a reflection point of the pulse laser beam.

Since each measurement point is represented by coordinates of the polar coordinate system, a set in a range of a short distance is high in density, while a set in a range of a long distance is low in density. In an example, when measurement points are associated with lattice points of a square lattice that is set on a two-dimensional plane, a distance between adjoining measurement points spreads as to a measurement point set in a range of a short distance and narrows as to a measurement point set in a range of a long distance.

The measurement device 20 not only takes three-dimensional measurements but also includes a function configured to capture images of the three-dimensional structure 30. The measurement device 20 accordingly includes a solid-state image sensing device such as a CCD image sensor or a CMOS image sensor, and a wide-angle optical system disposed in front of the solid-state image sensing device. For example, the measurement device 20 is configured to rotate the measurement module twice in the plane parallel with the installation surface while obtaining three-dimensional coordinate points of parts of the three-dimensional structure 30 during a first rotation and capturing images of the three-dimensional structure 30 during a second rotation.

The measurement device 20 includes the wide-angle optical system, and accordingly has a deep depth of field and can obtain images in focus without adjusting a focus of the optical system even if a distance up to the three-dimensional structure 30 changes. However, one image cannot cover the same range as the collection of first data. The measurement device 20 accordingly captures a plurality of (e.g., about one hundred) images while the measurement module is moving, and then combines the captured images.

The captured images may be monochrome gray-scale images, but are color images in the following example where respective brightness data of red, green and blue are output. Hereinafter, color image data are called color information. In addition, a collection of image data to be output from the measurement device 20 is called a collection of second data. Besides the 3D laser scanner described above, Kinect (trademark) is known as such a measurement device 20 configured to output each first data and each second data.

The measurement device 20 has a function configured to associate the collection of second data including pixel values of color images with the collection of first data. In other words, the function of the measurement device 20 is configured to associate each measurement point with corresponding color information. The measurement device 20 identifies a pixel of color images, corresponding to each measurement point based on the emission directions of laser beams from the measurement module and view fields in capturing color images, and associates color information of the pixel with coordinates of a corresponding measurement point.

Figure 4:
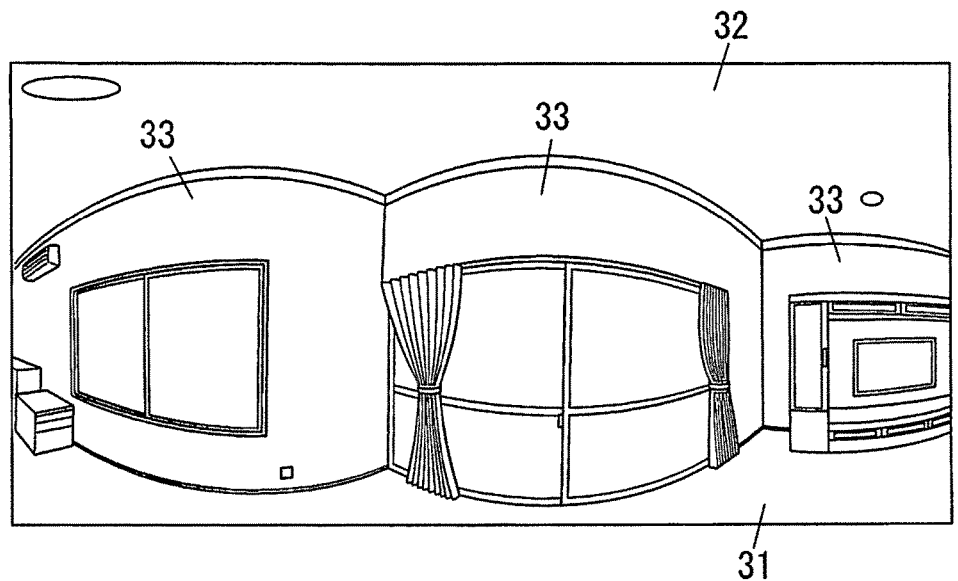
FIG. 4 is a view illustrating an example of images produced by a measurement device in the embodiment.

Images obtained in this way are distorted as shown in FIG. 4, for example. Such distorted images are caused by the measurement points being arranged on the two-dimensional plane, thereby spreading and narrowing a distance between each adjoining measurement points in a range of a short distance and in a range of a long distance, respectively, as stated above.

Thus, the measurement device 20 produces the collection of first data on a three-dimensional form of the three-dimensional structure 30 and the collection of second data on respective color information of parts of the three-dimensional structure 30. As described above, each second data are associated with three-dimensional coordinates of a measurement point as a corresponding first data. That is, pixels forming the two-dimensional images shown in FIG. 4 correspond one by one to the measurement points, and each have their own information on three-dimensional coordinate points and their own color information. In other words, choosing a pixel from the color images is equivalent to choosing a corresponding measurement point, and first data corresponding to the pixel is to be extracted.

The measurement device 20 is not limited to the configuration in which pulse laser beams are emitted, but may be a configuration in which a linear, stripe or a lattice image(s) is(are) projected. The measurement device 20 may be a range image sensor that is configured to receive reflected intensity-modulated light through an area image sensor to produce range images, each pixel value of which is a distance value, from an output of the area image sensor. Alternatively, the measurement device 20 may be configured to measure a flight time from emitting light except for intensity-modulated light to receiving the light. In place of the flight time, it may have a configuration based on a principle of a triangulation method such as a stereo image method.

In the case where the measurement device 20 is configured to measure each first data by the stereo image method, it is possible to set a pixel value, obtained from gray-scale or color images for calculating first data, to corresponding second data. In the case where the measurement device 20 is configured to take measurements by intensity-modulated light, it is possible to obtain each second data from gray-scale images in response to respective received light intensity. In this configuration, respective reflected light intensity is integrated over one or more periods of intensity-modulated light, so that a change in reflected light intensity can be reduced according to time elapsed.

The measurement device 20 may be configured to output only each first data. The measurement device 20 may have a function configured to convert coordinate points of the polar coordinate system into coordinate points of a rectangular coordinate system which is set for the measurement device 20. The coordinate system of the measurement device 20 is set without depending on the arrangement of the three-dimensional structure 30. For example, a vertical direction is dealt as a z-axis, and a reference point thereof is set to 0 meter above sea level. Alternatively, a plane on which the measurement device 20 is installed may be dealt as an xy plane.

In the case where the measurement device 20 is configured not only to output respective coordinate values of the measurement points obtained based on flight times of the laser beams but also to output respective intensity of the received laser beams, it is possible to obtain the collection of first data from the respective coordinate values of the measurement points and to obtain the collection of second data from the respective intensity of the received laser beams. The respective intensity of the received laser beams depends on characteristics of parts on which the laser beams are focused, such as absorptivity, diffusion characteristics and flight distance of the laser beams. However, by producing images, pixel values of which are obtained from respective intensity of the received laser beams, it is possible to produce gray-scale images similar to the above gray-scale images. That is, in the case where the measurement device 20 is configured to output a collection of information on respective intensity of the received laser beams, the collection of information can be employed as the collection of second data.

A process of associating each first data with corresponding second data may be performed by not the measurement device 20 but the modeling device 10 to be described later. The modeling device 10 may also have a function configured to convert coordinate points of the polar coordinate system into coordinate points of the rectangular coordinate system. In short, the process of associating each first data with corresponding second data and a process of coordinate conversion from the polar coordinate system to the rectangular coordinate system may be performed by any of the measurement device 20 and the modeling device 10. Hereinafter, a process with respect to the three-dimensional structure 30 after coordinate points of the rectangular coordinate system are obtained is explained.

In the case where the measurement device 20 outputs the collection of information on respective intensity of the received laser beams and the collection of information is employed as the collection of second data, the collection of information on respective intensity of the received laser beams can be obtained from respective information of laser beams when obtaining coordinate points. It is therefore unnecessary to obtain the collection of second data and also to associate each second data with corresponding first data.

In the embodiment, since the room has the three-dimensional structure 30, the three-dimensional structure 30 is formed of a floor (face) 31, a ceiling (face) 32 and walls (wall faces) 33 as shown in FIG. 3. Therefore, the measurement device 20 is to output the collection of first data and the collection of second data about an internal space of the three-dimensional structure 30. It is assumed that each first data is represented by coordinates of the rectangular coordinate system and each second data are associated with corresponding first data (measurement point). Hereinafter, the faces of the floor 31, the ceiling 32 and the walls 33 are simply referred to as faces 3 when they are not distinguished from each other. The ceiling 32 is not necessarily paralleled with the floor 31, but in the embodiment, the ceiling 32 is in parallel with the floor 31.

The measurement device 20 has a comparatively wide view field (measurement range), but cannot measure the whole of the internal space of the three-dimensional structure 30 by measuring one time. However, when part of the internal space of the three-dimensional structure 30 is measured as a target space according to a measurement purpose, the purpose can be achieved just by measuring one time.

In the embodiment, the whole of the internal space of the three-dimensional structure 30 is to be measured. The measurement device 20 accordingly takes measurements while changing arrangement and direction thereof. The function of the measurement device 20 is not explained in detail, but the measurement device 20 has a function configured to combine, without overlap based on attributes of the measurement points, the collection of first data and the collection of second data obtained by measuring two or more times. If the measurement device 20 is arranged in proper position while measuring two or more times, the collection of first data and the collection of second data that are output from the measurement device 20 include a collection of information on all faces of the three-dimensional structure 30.

The modeling device 10 produces a model of the three-dimensional structure 30 based on a collection of data obtained from the measurement device 20. For example, the model of the three-dimensional structure 30 is a wire frame model. The wire frame model has data structure in which points on the faces of the three-dimensional structure 30 are connected by line segments in order to shape surface form of the three-dimensional structure 30. However, the model may be a surface model. The modeling device 10 may have a function configured to extract different information on the three-dimensional structure 30 based on the model. The modeling device 10 may be configured to function as a layout simulator when provided with a function configured to change surface attributes of the faces 3 of the three-dimensional structure 30 in a virtual space by computer graphics, a function configured to position an article(s) 34 in the virtual space, and the like. These functions are described later.

In order to realize the functions of the modeling device 10, the modeling device 10 is formed of a computer that operates in accordance with a program(s). It is desirable that the computer include a keyboard and a pointing device as an input device 18, and a display device as an output device 17. The computer may be a tablet terminator or a smart phone, which integrally includes a touch panel as the input device 18 and a display device as the output device 17.

In place of these general purpose computers, the computer may be dedicated apparatus. The computer may be a computer server or a cloud computing system. Functions to be explained below may be provided by a terminal device that enables a user to communicate with a computer server or a cloud computing system.

The program may be provided by a computer-readable storage medium or by telecommunications line such as Internet. The program enables a computer to function as the modeling device 10 including the following functions.

As shown in FIG. 1, the modeling device 10 includes a receiver 11 configured to obtain a collection of first data and a collection of second data from the measurement device 20. The receiver 11 is configured to obtain the collection of second data desirably, but may be configured to obtain only the collection of first data. The modeling device 10 includes a model producer 14 configured to produce a model of the three-dimensional structure 30 based on the collection of first data on the three-dimensional structure 30, obtained by the receiver 11.

In the embodiment, since the room has the three-dimensional structure 30, when part of the faces 3 is hidden behind furniture, facilities or the like as seen from the measurement device 20, the hidden part cannot be measured. Therefore, the modeling device 10 according to the embodiment estimates a whole shape of the faces 3 based on information obtained by measuring part of the faces 3 and knowledge of the faces 3 (i.e., regularity or law), thereby estimating the whole shape of the faces 3, or the whole shape of the three-dimensional structure 30.

The knowledge of the faces 3 contains knowledge of shapes of the faces 3 and knowledge of arrangement of different faces 3. Knowledge of "a room of a building is surrounded by aggregate planes" is employed as the knowledge of shapes of the faces 3. In a case where the faces 3 are not planes, comparatively simple curved surfaces (U-shape in section, hemispherical shape, or the like) may be employed. It is however assumed that the faces 3 are planes in the embodiment. Knowledge of "a boundary line between adjoining faces 3 is included in intersection lines among adjoining faces 3" is employed as the knowledge of arrangement of different faces 3. In addition, since the faces 3 are planes, knowledge of "a vertex as one end of a boundary line is commonly shared among three faces 3" is employed.

From the aforementioned respective knowledge, it is recognized that a model of the three-dimensional structure 30 is represented by vertexes as corners of planes forming the three-dimensional structure 30 and line segments each of which connects two vertexes. In order to produce a model of the three-dimensional structure 30, the faces 3 need to be identified based on a collection of first data or a collection of second data from the measurement device 20. That is, the modeling device 10 includes a face extractor 12 that is configured to identify each of the faces 3 to produce, for each of them, an equation describing an identified face 3 based on respective first data of a plurality of (three or more) measurement points of the identified face 3. In the embodiment, the faces 3 are planes and the equation describing the face 3 is a plane equation to be described later.

The modeling device 10 also includes a vertex extractor 13 that is configured to extract, every three faces 3, a vertex shared among them based on the equations produced by the face extractor 12. The model producer 14 provided for the modeling device 10 is configured to produce information on a model representing the three-dimensional structure 30 based on the equations produced by the face extractor 12 and the vertexes extracted by the vertex extractor 13. The model producer 14 is configured to extract, every two adjoining faces 3, an intersection line shared therebetween as a boundary line between two faces 3 based on the equations produced by the face extractor 12. That is, the model producer 14 defines two vertexes on each intersection line shared between two adjoining faces 3 as end points, and defines a line segment between the two end points as a boundary line of the two adjoining faces 3.

In this case, the model producer 14 produces information on a model represented by aggregate boundary lines. That is, the model producer 14 is configured to store a wire frame model in which coordinates of each vertex of the model are associated with a boundary line including the vertex as an end point. The model producer 14 may be configured not only to produce the wire frame model represented by the vertexes and the boundary lines, but also to represent a model of the three-dimensional structure 30 based on respective equations describing the faces 3 and vertexes of each face 3.

If the information stored in the model producer 14 is given to a program for displaying images on a screen of the display device, the model of the three-dimensional structure 30 is displayed on the screen of the display device. Since the model is formed based on three-dimensional coordinate points, a virtual space of the three-dimensional structure 30 is formed by computer graphics.

At least one of configurations is employed for the face extractor 12, where one of them is a configuration in which all faces 3 are indicated by a user through the input device 18, and the other is a configuration in which part of the faces 3 such as a floor 31 or a ceiling 32 is automatically identified by focusing on an attribute of each first data.

The configuration in which the faces 3 are indicated by the user is realized by a function configured to display color images formed by a collection of second data on the display device as the output device 17, and a function configured to recognize a region, indicated through the input device 18, of the color images as a region including a face(s) 3.

Note that color images displayed on the screen of the output device 17 are images having comparatively large distortion as stated above (see FIG. 4). In such images, each boundary line between faces 3 has bending or distortion, which makes it hard for an inexperienced worker to distinguish the faces 3. In the embodiment, color images are displayed on the screen of the output device 17. Therefore, a user can comparatively easily distinguish the faces 3 based on color information on each face 3 as judgement information for distinguishing kinds of faces 3.

The input device 18 allows identification of a desired region of color images while the color images showing a whole of three-dimensional structure 30 are displayed on the screen of the output device 17. It is desirable that when a user indicates a face(s) 3, a selection frame having an appropriate shape is displayed on the screen of the output device 17 so that the selection frame is allowed to be moved in a range including the face 3 to be identified. The selection frame may be any of various shapes, but preferably is a simple shape such as a quadrangle, a triangle or an ellipse.

As stated above, the user sets the selection frame in the range including the face 3 through the input device 18, and thereby an extraction range of measurement points of the face 3 is dialogically input by the selection frame with respect to the images displayed on the output device 17. That is, the user is allowed to set the selection frame to any of all faces 3 of the room (floor 31, ceiling 32 and walls 33) by operating the input device 18 while viewing images displayed on the screen of the output device 17.

The face extractor 12 extracts respective first data about three measurement points of which relative positions to an outline of the selection frame are preset in a range of the selection frame. Since each first data is three-dimensional coordinates, three coordinate points in an identical plane are obtained and thereby an equation of a plane including the three measurement points that are set by the selection frame is determined uniquely. In short, an equation describing the plane including the three measurement points is obtained.

However, in the face extractor 12, the selection frame is not necessarily set in order to obtain the three measurement points. For example, in a case where a pointing device such as a mouse or a touch pen is employed as the input device 18, three or more measurement points may be selected in turn through the input device 18.

An equation describing a face 3 is represented by a plane equation of $ax+by+cz+d=0$. Parameters of the plane equation are defined as:

$$a=(By-Ay)(Cz-Az)-(Cy-Ay)(Bz-Az);$$

$$b=(Bz-Az)(Cx-Ax)-(Cz-Az)(Bx-Ax);$$

$$c=(Bx-Ax)(Cy-Ay)-(Cx-Ax)(By-Ay); \text{ and}$$

$$d=-(Ax+bAy+cAz),$$

where respective coordinates of the three measurement points A, B and C extracted by the face extractor 12 in order to define the one face 3 are (Ax, Ay, Az), (Bx, By, Bz) and (Cx, Cy, Cz).

The plane equation is obtained by the aforementioned calculation using the respective coordinates of the three measurement points A, B and C extracted by the face extractor 12, but there is a possibility that each coordinate point contains a measurement error. It is therefore desirable that in place of the respective coordinates of the extracted three measurement points A, B and C, the face extractor 12 find, for each of the three measurement points A, B and C, middle (median) or average coordinates (point) of measurement points included in a prescribed range surrounding a measurement point A, B or C, as a coordinate point for defining the equation.

Then, by setting a plane defined by a plane equation obtained in this way as a plane candidate to determine an equation of the face 3 based on measurement points existing in a range of a prescribed distance from the plane candidate, it is possible to define an equation of the face 3 more accurately. An existence range of measurement points for determining the equation of the face 3 may be set so that a distance from the plane candidate is in a range of +/−10 mm, but desirably be set to +/− several mm or less. Measurement points, existing in the range of the prescribed distance from the plane candidate, of a set including all measurement points obtained by the receiver 11 are employed as measurement points for determining the equation of the face 3. However, only the measurement points existing inside the aforementioned selection frame may be employed as such a set because if all measurement points obtained by the receiver 11 are employed as a set, it is liable to include measurement points causing error.

The face extractor 12 calculates the parameters a, b, c and d of the plane equation that meets measurement points extracted from the set based on robust estimation in order to determine the equation of the face 3. The robust estimation is employed in order to reduce large gaps as a result of influence of unexpected values having large residuals when the equation is determined based on a least-squares method. In this example, a biweight method of Turkey is employed as a method of the robust estimation.

That is, when the equation of the face 3 is determined, a weighting factor larger than that for measurement points having residuals that exceed the prescribed value is applied to measurement points having residuals that are a prescribed value or less, and then the plane equation is determined based on the least-squares method. For example, the weighting factor is set to 2 (i.e., twice as large as a weighting factor with respect to other measurement points). In short, by applying the weighting factor, according to contribution with respect to the equation of the face 3, to the measurement points, it is possible to prevent the equation of the face 3 from largely shifting by the unexpected values having large residuals. As a result, a robust plane can be estimated.

However, the face extractor 12 may determine the plane equation based on another method in place of the robust estimation. For example, the face extractor 12 may obtain a plurality of plane equations by performing a process of determining a plane equation based on three measurement points with respect to various measurement points and then determine an average of the plurality of plane equations as a plane equation to be employed. That is, the face extractor 12 may calculate parameters a, b, c and d of each of the plurality of plane equations to determine a plane equation having respective averages of the calculated parameters. Alternatively, the face extractor 12 may determine a plane equation based on the least-squares method without using any weighting factor.

In the abovementioned configuration example, a user uses the output device 17 and the input device 18, thereby dialogically setting an extraction range of measurement points to be included in a plane. As explained below, measurement points of the floor 31 and the ceiling 32 can be automatically extracted based on a collection of first data even if a user does not indicate an extraction range of measurement points.

It is assumed that a z-axis of a three-dimensional rectangular coordinate system is defined as a vertical direction or a direction perpendicular to an installation surface of the measurement device 20. The floor 31 is installed so that it is perpendicular to the vertical direction in general except for a case where a slope is formed. Accordingly, when the measurement device 20 is installed on the floor 31, the direction perpendicular to the floor 31 is equivalent to the vertical direction. In addition, in the embodiment, it is assumed that the ceiling 32 is in parallel with the floor 31.

Figure 5:
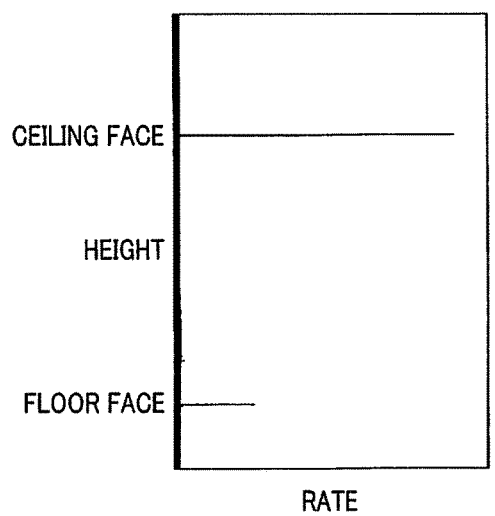
FIG. 5 is a view illustrating a principle for automatically extracting a face of a part in the embodiment.

Measurement points corresponding to the floor 31 or the ceiling 32 have an identical coordinate in the z-axis direction under the aforementioned conditions. That is, if a rate of measurement points having an identical coordinate in the z-axis direction is calculated, it is expected that a rate of measurement points corresponding to the floor 31 or the ceiling 32 is considerably high as compared with a rate of the other measurement points as shown in FIG. 5.

Therefore, the face extractor 12 calculates a rate of such measurement points for each of preset sections divided along the z-axis and detects the floor 31 or the ceiling 32 when the rate exceeds a prescribed reference. That is, by setting the reference properly, only two sections are detected as a section, a rate of which exceeds the reference. It can be therefore considered that one of them represents a range of z-coordinates of the floor 31 and the other represents a range of z-coordinates of the ceiling 32. In fact, a lower section and an upper section of the two sections in a real space correspond to the floor 31 and the ceiling 32, respectively.

There is a possibility that rates in three or more sections exceed the reference because there is a possibility that a rate of the floor 31 or the ceiling 32 decreases in a case where the floor 31 or the ceiling 32 has a difference in level or in a case where furniture is arranged. Therefore, the face extractor 12 judges a lowest section in the z-axis of sections, a rate of each of which exceeds the reference to be a section that satisfies conditions of the floor 31, and judges that each first data included in the lowest section correspond to the floor 31.

The face extractor 12 is also configured, when an upper section than the floor 31 of sections, a rate of each of which exceeds the reference satisfies conditions of the ceiling 32, to judges that each first data included in the upper section correspond to the ceiling 32. For example, the conditions of the ceiling 32 include a condition that a distance from a section that satisfies the conditions of the floor 31 is in a permissible range, and a condition that a rate is maximum in candidates of the ceiling 32. A most upper section of sections, a rate of each of which exceeds the reference, in a real space may be employed as the conditions of the ceiling 32.

If each first data of the floor 31 and the ceiling 32 is obtained, respective first data corresponding to coordinates between the floor 31 and the ceiling 32 are candidates of respective first data of the walls 33. The walls 33 can be distinguished from other articles by evaluating each first data as the candidates of the walls 33. Details are not described here, but it is evaluated whether or not each first data is of an identical plane, a rate of each first data is calculated every plane, and a distance from the measurement device 20 is employed as auxiliary information. As a result, the walls 33 can be distinguished from furniture or the like. The walls 33 have various shapes, and accordingly it may be hard to perform automatic extraction like the floor 31 and the ceiling 32. Therefore, a face 3 of the walls 33 may be indicated by a user through the input device 18.

The floor 31 may be provided with a lid of an underfloor storage, a lid of an underfloor inspection hole, a carpet, furniture, foliage plants and the like. Lighting fixtures and the like may be on the ceiling 32. Curtains, windows and the like may exist at a side of the walls 33. That is, at an each side of some faces 3, an obstacle to extract a face 3 exists, and in renovation or the like, members to be paid attention may be arranged. Desirably, measurement points of the obstacles and the members are excluded from an extraction range of measurement points because they cannot be employed as measurement points of a face 3 by the face extractor 12.

It is therefore desirable that the modeling device 10 include a color extractor 123 that is configured to extract each second data having color information in an indicated range to display extracted each data on the screen of the output device 17. The color extractor 123 is configured to set a range of color information to be extracted so that it excludes particular color information about colors of the aforementioned obstacles and members from a collection of second data obtained by the receiver 11 to extract the floor 31, the ceiling 32 and the walls 33.

The color extractor 123 may be configured to define the range of color information so that the floor 31, the ceiling 32 and the walls 33 are individually displayed on the output device 17. Desirably, the range of color information to be extracted by the color extractor 123 is preset. However, it may be configured to extract color information of part in which a cursor is. It is desirable that color information of each of measurement points of different faces 3 can be extracted and color information every measurement point, color difference from which is in a prescribed range can be extracted. If the color extractor 123 is configured in this way, it is possible to extract measurement points having color information corresponding to the floor 31, the ceiling 32 or the walls 33 in a lump and to exclude measurement points having other color information.

The color extractor 123 is configured to indicate color information of each measurement point to be extracted, but may be configured to indicate color information of each measurement point to be excluded.

As stated above, the color extractor 123 can roughly discriminate measurement points of the obstacles or the members different from the floor 31, the ceiling 32 and the walls 33 based on color information obtained from each second data. For example, if obstacles such as furniture and foliage plants are different in color from the floor 31, the ceiling 32 and the walls 33, the color extractor 123 can exclude measurement points of the obstacles or the members based on a collection of color information.

As a result, a user can easily position the selection frame when the user indicates an extraction range of measurement points through the input device 18. A place to be paid attention in renovation of the room can be immediately checked on the screen of the output device 17, and accordingly attention can be called when members for renovation are supplied.

If the input device 18 is operated so that a frame surrounding an opening such as a window or an entrance is displayed on the screen of the output device 17 and a size of the frame is adjusted so that the frame agrees on the opening, the opening can be added to a model. By manually performing only setting of the frame, a subsequent process of making the frame agree on the opening can be automated. A work for making the frame agree on the opening can be performed in the same way as a general drawing graphics software. For example, a rectangular frame can be moved at a position of the opening on the screen by dragging the whole frame while the frame is selected by mouse click with the frame displayed on the screen. The size can be also adjusted so that the frame is expanded and contracted lengthwise and breadthwise to agree on the opening by dragging part of the frame with the frame selected by mouse click.

As stated above, if the face extractor 12 produces respective equations describing the floor 31, the ceiling 32 and the walls 33, the vertex extractor 13 extracts every vertex shared among the floor 31 and two walls 33 and every vertex shared among the ceiling 32 and two walls 33, for example. In a case where the ceiling 32 is inclined and part of the ceiling 32 is in contact with the floor 31, the vertex extractor 13 extracts every vertex shared among the floor 31, the ceiling 32 and a wall 33. If the floor 31 includes a difference in level, it extracts every vertex shared among two faces forming the difference in level and a wall 33. That is, the vertex extractor 13 is configured to extract, every three faces 3 of the three-dimensional structure 30, a vertex shared among them.

A method for, when the vertex extractor 13 extracts every three faces 3 a vertex shared among them, selecting the three faces 3 in question includes a method based on a user's manual operation and an automatic selection method.

In a case where a user manually indicates faces 3, the vertex extractor 13 is configured to dialogically receive faces 3 as targets for extraction of a vertex through the input device 18 with images by a collection of second data displayed on the output device 17 forming the face extractor 12. In this case, a user requires positioning a cursor in each of three faces 3 having a vertex (coordinates) to be found and then to perform a selection operation of the face 3 (clicking a mouse, pressing a return key or the like).

When three or more measurement points are selected in order to allow the face extractor 12 to produce a plane equation, by making a rule with respect to order of faces 3 for indicating measurement points, a process of inputting faces 3 having a vertex to be extracted through the input device 18 can be omitted. That is, by making such a rule, a work for indicating the faces 3 having the vertex to be extracted can be performed at the same time to indicate measurement points. For example, a rule may be set so that measurement points for obtaining a plane equation are indicated in order of the floor 31, the ceiling 32 and the walls 33 and measurement points of each wall 33 are indicated clockwise.

The vertex extractor 13 deals respective three equations describing the selected three faces 3 as simultaneous equations and calculates solutions of the equations. The calculated solutions are three-dimensional coordinates of a vertex shared among the three faces 3. By repeating the aforementioned process until every vertex of the three-dimensional structure 30 is obtained, three-dimensional coordinates of every vertex of the three-dimensional structure 30 can be calculated.

In a case where the faces 3 are automatically selected every three faces 3, the vertex extractor 13 makes, from all faces 3 obtained by the face extractor 12, combinations each of which includes three faces 3 and deals three equations obtained for each of the combinations as simultaneous equations to calculate solutions thereof. In a case where the three-dimensional structure 30 has a simple shape such as a rectangular parallelepiped, the solutions obtained in the above example are three-dimensional coordinates of a vertex of the three-dimensional structure 30. The simple shape means a shape in which the number of combinations that solutions are obtained agree with the number of the vertexes. For example, the rectangular parallelepiped is a simple shape because the number of combinations having solutions of 20 combinations each of which includes three faces 3 is eight and the number of vertexes thereof is eight.

Figure 6:
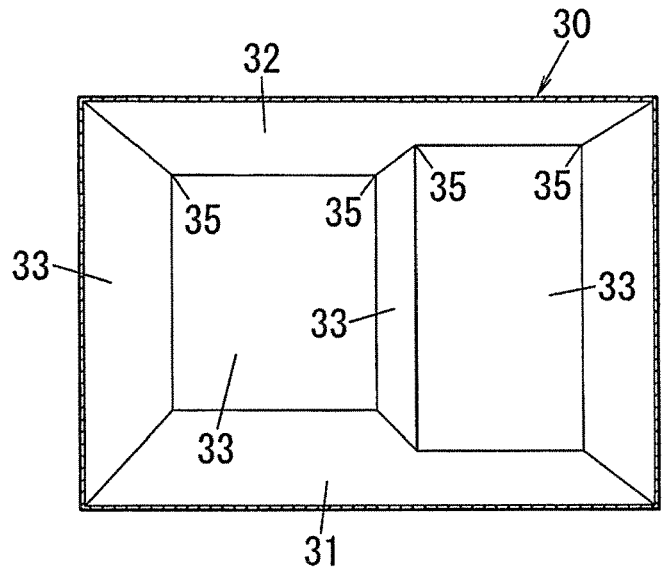
FIG. 6 is a perspective view showing an example of three-dimensional structure in the embodiment.
Figure 7A:
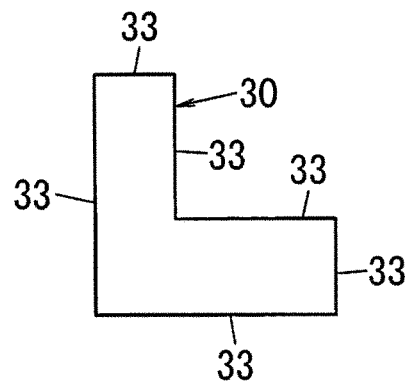
FIGS. 7A and 7B are views illustrating a principle for verifying a vertex in the embodiment.
Figure 7B:
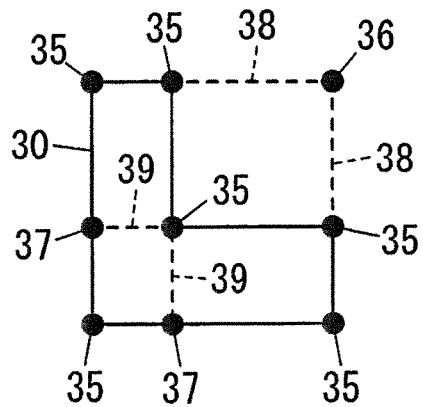

In a case where the three-dimensional structure 30 is not in a simple shape such as a rectangular parallelepiped, the number of solutions may not agree with the number of vertexes. For example, it is assumed that the three-dimensional structure 30 is obtained from a room having walls 33 in the shape shown in FIG. 6. That is, the room is shaped like an L as shown in FIG. 7A, and has not four but six walls 33. In this case, the number of vertexes is 12, but the number of combinations each of which includes three faces 3 is 56, in which the number of combinations that solutions are obtained is 18. That is, 6 solutions of the obtained solutions represent non-existing coordinate points. Thus, coordinate points not corresponding to vertexes of the three-dimensional structure 30 may be calculated.

In order to exclude such non-existing vertexes, the modeling device 10 shown in FIG. 1 includes a verifier 131. The verifier 131 is configured to verify whether or not each vertex extracted by the vertex extractor 13 is a real vertex, and then exclude every non-existing vertex. As the process of the verification, it judges whether or not any measurement points exist in three faces 3 to be shared for each of the vertexes extracted by the vertex extractor 13, and if no measurement points exist in at least one of the faces 3, excludes a corresponding vertex.

There is however a possibility that no measurement points exist in a face(s) 3 owing to an error in each measurement point. Therefore, a permissible range is set for the judgment on existence or absent of measurement points in a face(s) 3. Specifically, the verifier 131 is based on a distance range according to the permissible range, and if measurement points exist in the distance range from a face 3, judges that the measurement points exist in the face 3.

In the case of the room (three-dimensional structure 30), a floor 31 of which is in a shape of an L as shown in FIG. 7A, solutions obtained from equations describing the walls 33 correspond to not only vertexes 35 really existing in the room but also virtual vertexes 36 and 37. The vertexes 36 are obtained according to calculations and at positions extended outward from corresponding walls 33 of the room, while the vertexes 37 are obtained according to calculations and at positions extended inward from each corresponding wall 33 of the room.

The verifier 131 is configured to judge, for each of all vertexes 35, 36 and 37 obtained according to calculations, whether or not measurement points exist in each of three faces 3 sharing a vertex. In the illustrated example, faces sharing each of the virtual vertexes 36 outside the room are only virtual faces 38 outside the room, and no measurement points exist in the faces 38. Therefore, the vertexes 36 are excluded. Faces sharing each of virtual vertexes 37 inside the room are really existing faces 33 and a virtual face 39 inside the room, and no measurement points exist in the virtual face 39. Therefore, each vertex 37 is excluded.

The model producer 14 is configured to produce a model, representing the three-dimensional structure 30, formed of a set of boundary lines each of which is a straight line connecting vertexes obtained by the vertex extractor 13 and a straight line along an intersection line between two adjoining faces. The model producer 14 is also configured to store, as model information, information on three-dimensional coordinates of each vertex and each vertex pair connected by a corresponding boundary line.

A monitor device 41 is to display a virtual space having three-dimensional information by displaying the three-dimensional structure 30 on a screen of the monitor device 41 (see FIG. 8) by technology of computer graphics based on the model information stored in the model producer 14. Desirably, the monitor device 41 doubles as the output device 17, but the monitor device 41 may be provided separately from the output device 17.

The model producer 14 stores the model information, and accordingly can calculate a distance between vertexes on each boundary line in the model. That is, it can easily calculate each distance between vertexes in a real space based on coordinates of each vertex because three-dimensional coordinates of each vertex of boundary lines are calculated based on a collection of first data as a result of three-dimensional measurements by the measurement device 20 with respect to the three-dimensional structure 30. That is, it is desirable that the modeling device 10 include a dimension calculator 15 configured to calculate a dimension of each of the boundary lines based on coordinates of each vertex. It is further desirable that the modeling device 10 include a drawing generator 16 configured to generate drawing information to which dimensions of the three-dimensional structure 30 calculated by the dimension calculator 15 are applied. Values of the dimensions calculated by the dimension calculator 15 are reflected in a drawing generated by the drawing generator 16.

Desirably, the drawing generator 16 makes a development view of the three-dimensional structure 30, which is a dimension diagram including dimensions calculated by the dimension calculator 15. A distribution drawing including dimensions of construction members may be generated in a case where the room has the three-dimensional structure 30, and wallpapers, thermal insulating sheets, soundproof sheets and the like are additionally installed on or in the walls. Attachment positions of the members are also described in the distribution drawing in consideration of thickness dimensions of members to be installed. In the distribution drawing to be generated, the faces 3 may be associated with attributes so as to contain texture or a color tone of each member as described later.

In the aforementioned example, equations describing the faces 3 are obtained based on measurement points surely included in the faces 3, and the model of the three-dimensional structure 30 is produced according to calculations based on the equations. The model produced by the model producer 14 does not therefore include objects except for the three-dimensional structure 30, openings of the three-dimensional structure 30 and the like. The distribution drawing requires such information, and it is accordingly desirable that the drawing generator 16 allow a user to edit the drawing through an operation device (that the input device 18 may double as).

In the case of the aforementioned example, it is assumed that the ceiling 32 is in parallel with the floor 31, but the ceiling 32 doesn't need to be in parallel with the floor 31 when the faces 3 are indicated through the input device 18. For example, in a case where the ceiling is an exposed attic with no ceiling board, the ceiling 32 includes inclined parts with respect to the floor 31. In another example of the room, the ceiling 32 is inclined along slant of a roof and a boundary line is formed of a lower end of the ceiling 32 and the floor 31. The floor 31 is hardly inclined, but in the case where the floor 31 includes a difference in level, three or more vertexes may be formed between the floor 31 and one wall 33.

Even in the case of the room having the aforementioned shape, the vertex extractor 13 can extract a vertex shared among three adjoining faces of the floor 31, the ceiling 32 and the walls 33. The model producer 14 can therefore produce the model information representing the three-dimensional structure 30 based on plane equations and vertexes. That is, since the model producer 14 can produce a model even if the ceiling 32 is inclined, the drawing generator 16 can generate a distribution drawing in a case where heat insulators are installed in the ceiling 32.

Figure 8:
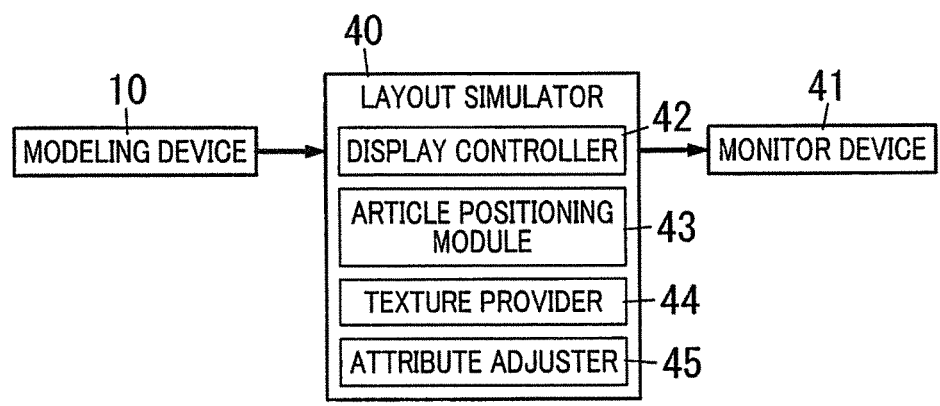
FIG. 8 is a block diagram showing a configuration example of a layout simulator.

Various changes can be added to the virtual space by the computer graphics obtained from the three-dimensional structure 30 based on the model information produced by the modeling device 10. That is, if a layout simulator 40 based on technology of 3D graphics is provided as shown in FIG. 8, changes can be added to the virtual space by giving various attributes to the model through the layout simulator 40.

A desirable example of the changes given to the virtual space includes arrangement of other articles in the virtual space, adjustment of texture or a color tone of a face(s) 3 and the like. The layout simulator 40 may include a function configured to simulate lighting, a function configured to change a position of a viewpoint, and the like.

Figure 9:
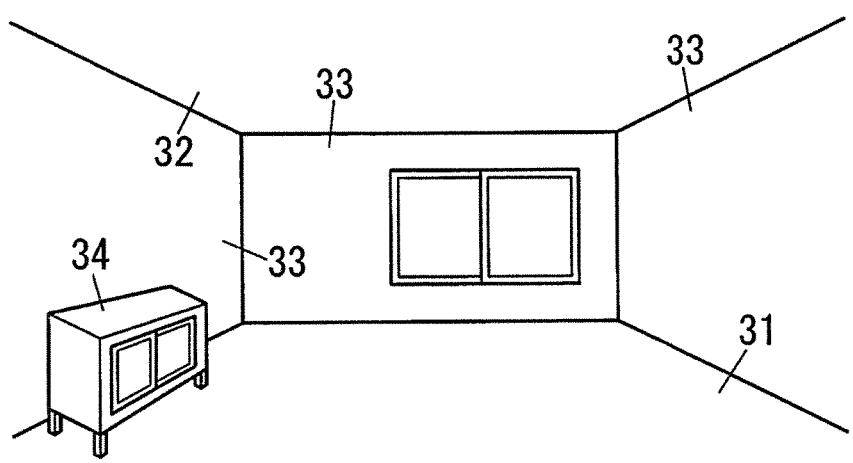
FIG. 9 is a perspective view showing an example of a virtual space in the embodiment.

Since a room is exemplified as the three-dimensional structure 30, desirably the layout simulator 40 includes an article positioning module 43 configured to position an article(s) such as furniture in the room. The article positioning module 43 is configured, based on known three-dimensional data about the article 34 such as furniture (see FIG. 9), to position the article 34 in the virtual space. The layout simulator 40 includes a display controller 42 configured to allow the monitor device 41 to display the virtual space on the screen thereof. It immediately reflects the virtual space, which the article 34 is positioned in, in the display on the screen of the monitor device 41.

The layout simulator 40 further includes a texture provider 44 configured to give texture information to a face(s) 3 of the model, and an attribute adjuster 45 configured to adjust an attribute including positions of an article(s) 34 and the texture. Desirably, the attribute adjuster 45 includes a function configured to adjust color tones of the article(s) 34 and a face(s) 3.

The layout simulator 40 can simulate not only texture and color of each of the floor 31, the ceiling 32 and the walls 33, but also a kind or arrangement of an article(s) 34. In a case where there is a plan of renovation to a room(s), it is possible to provide a simulation result after the renovation. As a result, persuasion against customers can be enhanced.

The layout simulator 40 can be realized by commonly using a computer forming the modeling device 10, and also realized by a different computer from the computer forming the modeling device 10. The function of the layout simulator 40 may be realized by the computer server or the cloud computing system like the modeling device 10.

In the aforementioned example, the modeling device 10 employs a collection of second data, but the collection of second data is not necessarily required. As can be seen from the aforementioned technology, the model can be produced from only a collection of first data.

As explained above, the modeling device 10 according to the embodiment includes the receiver 11, the face extractor 12, the vertex extractor 13 and the model producer 14. The receiver 11 is configured to obtain, as first data, three-dimensional coordinates of each of measurement points of the three-dimensional structure 30 from the measurement device 20. The face extractor 12 is configured to produce, for each of the plurality of faces 3, a plane equation describing a face 3 based on first data on each of measurement points of the face 3. The vertex extractor 13 is configured to calculate, every adjoining faces of the plurality of faces, a point that simultaneously satisfies respective plane equations describing adjoining faces, thereby extracting the point as a vertex shared among the adjoining faces. The model producer 14 is configured to produce model information representing the three-dimensional structure 30 based on each plane equation and each vertex. The face extractor 12 is configured to define, as a plane candidate, a plane described by a plane equation obtained based on coordinates of each of three measurement points of one face, and to determine a plane equation by recalculation based on measurement points existing in a range of a prescribed distance from the plane candidate.

Figure 2A:
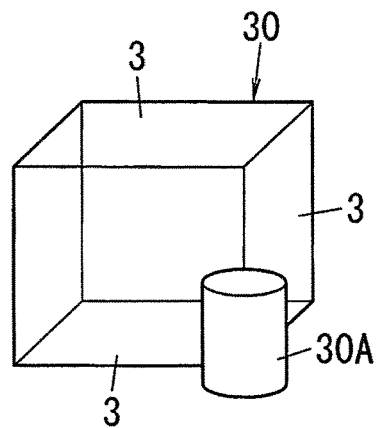
FIGS. 2A and 2B are a views illustrating concept of an operation example of the embodiment.
Figure 2B:
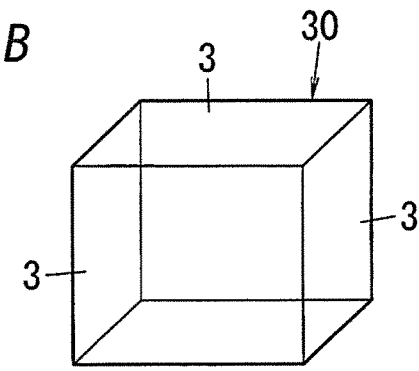

In a case of the configuration, as shown in FIG. 2A, even when part of the three-dimensional structure 30 is hidden behind another obstacle 30A, a boundary line of faces 3 hidden behind the obstacle 30A can be estimated. As a result, as shown in FIG. 2B, a model with the obstacle 30A removed can be produced. The face extractor also determines the plane equation by recalculation based on the measurement points existing in the range of the prescribed distance from the plane candidate after defining the plane candidate. It is accordingly possible to realize high-precision model reproducibility with respect to a shape of the three-dimensional structure. In particular, a high-precision plane equation can be determined as a result of the face extractor performing robust estimation during the recalculation.

For example, a room surrounded by the floor 31, the ceiling 32 and the walls 33 has the three-dimensional structure 30. Desirably, the face extractor 12 is configured to produce respective plane equations describing the floor 31, the ceiling 32 and the walls 33. Desirably, the vertex extractor 13 is configured to extract, every three adjoining faces of the floor, the ceiling and the walls, a vertex shared among them. Desirably, the model producer 14 is configured to extract, every two adjoining faces of the floor, the ceiling and the walls, a boundary line shared therebetween.

In this configuration, the model can be formed of line segments each of which connects two vertexes in the floor 31, the ceiling 32 and the walls 33. That is, it is possible to form a model having a shape similar to the room as the three-dimensional structure 30.

Desirably, the measurement device 20 has a function configured to output pixel values of images captured from the three-dimensional structure 30, as respective second data associated with the measurement points. In a case where the measurement device 20 is configured to output a collection of second data, desirably the face extractor 12 includes an output module 121 and an input module 122. The output module 121 is configured to allow the output device 17 to display the collection of second data on the screen of the output device 17. The input module 122 is configured to dialogically input, through the input device 18, information for indicating measurement points of a face 3 in images displayed on the output device 17.

In this configuration, a user can manually set the selection frame with reference to all faces 3 constituting the three-dimensional structure 30 by operating the input device 18 while viewing images displayed on the screen of the output device 17.

Desirably, each second data contains color information. Desirably, the receiver 11 includes a function configured to obtain a collection of second data from the measurement device 20, and the modeling device further includes the color extractor 123 configured to extract a collection of second data, each of which has color information in a preset range, from the collection of second data obtained by the receiver 11 to display on the screen of the output device 17.

In this configuration, a user can determine an extraction range of measurement points, from which a plane equation describing a face 3 is produced, based on colors of images displayed on the screen of the output device 17. In other words, measurement points to be removed when the plane equation describing the face 3 is produced can be excluded based on color information.

Desirably, the vertex extractor 13 is configured to dialogically input, through the input device 18, faces sharing a vertex with images displayed on the output device 17. In this case, it is desirable that the vertex extractor 13 be configured to calculate three-dimensional coordinates of a vertex shared among the faces that are input through the input device 18 by finding solutions of simultaneous equations as a set of plane equations.

In this configuration, faces sharing a vertex are indicated by a user through the input device 18. It is therefore possible to reduce process load of the vertex extractor 13 in comparison with a configuration in which a vertex extractor 13 combines faces extracted from the three-dimensional structure 30 to automatically find a vertex. That is, coordinates of each of vertexes for producing a model can be found easily.

The vertex extractor 13 may be configured to find, for each of combinations each of which includes three faces 3, solutions of simultaneous equations as a set of plane equations, thereby calculating three-dimensional coordinates of a vertex shared among the faces. Desirably, this configuration is provided with the verifier 131 configured, for each of vertexes extracted by the vertex extractor 13, when no measurement points exist in at least one of faces 3 sharing the vertex, to exclude the vertex.

In this configuration, when the vertex extractor 13 automatically combines faces 3 and solutions of simultaneous equations are found, the solutions can be found as a vertex automatically. In addition, the verifier 131 verifies whether or not a vertex automatically extracted by the vertex extractor 13 really exists, and accordingly a burden on a user can be reduced.

It is desirable that each first data be coordinates of a rectangular coordinate system, one coordinate axis of which is perpendicular to the floor 31. Desirably, the face extractor 12 is configured to calculate an existent rate of measurement points for each of sections divided along the coordinate axis, and when an existent rate of a section exceeds a prescribed reference and the section satisfies conditions of the floor, to judge that measurement points included in the section correspond to the floor.

In this configuration, since the floor 31 of faces 3 constituting the room is automatically determined, the ceiling 32 and the walls 33 can be extracted easily based on the floor 31.

It is assumed that the room has structure in which the ceiling 32 is in parallel with the floor 31. In this case, the face extractor 12 is desirably configured, when an existent rate of a section exceeds the prescribed reference and the section is above the section satisfying the conditions of the floor 31 and satisfies conditions of the ceiling 32, to judge that measurement points included in the section correspond to the ceiling 32.

In this configuration, the floor 31 and the ceiling 32 of the faces 3 constituting the room can be determined automatically. Therefore, by dealing remaining faces as the walls 33, a model of the room can be produced easily.

Desirably, the modeling device 10 according to the embodiment further includes the dimension calculator 15 configured to calculate distances, each of which connects vertexes, in the model, and the drawing generator 16 configured to produce information for describing a drawing which distances calculated by the dimension calculator 15 from the three-dimensional structure 30 are applied to.

The modeling device 10 configured in this way can automatically produce a drawing of the three-dimensional structure 30 and add dimensions to the drawing. In this configuration, a drawing with dimensions of the room can be made automatically in a case of renovation of the room or the like, thereby facilitating supply of members for renovation, for example.

The modeling method according to the embodiment provides process for producing the model based on a collection of first data obtained by taking three-dimensional measurements of the three-dimensional structure 30 having faces 3 through the measurement device 20. Therefore, according to modeling method, the receiver 11 obtains, from the measurement device 20 configured to take three-dimensional measurements of the three-dimensional structure 30 having the faces 3, obtain, as first data, three-dimensional coordinates of each of measurement points of the three-dimensional structure 30. According to modeling method, the face extractor 12 produces, for each of the faces 3, a plane equation describing a face 3 based on first data of each of measurement points of the face 3. The vertex extractor 13 calculates, every adjoining faces of the faces 3, a point that simultaneously satisfies respective plane equations describing adjoining faces, thereby extracting the point as a vertex shared among the adjoining faces. The model producer 14 produces a model representing the three-dimensional structure 30 based on the plane equations and the vertexes. The face extractor 12 defines, as a plane candidate, a plane described by a plane equation obtained based on coordinates of each of three measurement points of one face, and determines a plane equation by recalculation based on measurement points existing in a range of a prescribed distance from the plane candidate.

In this configuration, even when part of the three-dimensional structure 30 is hidden behind another obstacle, a boundary line(s) of faces hidden behind the obstacle can be estimated. As a result, as shown in FIG. 2B, a model except for the obstacle 30A can be produced. By determining the plane equation by robust estimation based on the measurement points existing in the range of the prescribed distance from the plane candidate after determining the plane candidate, it is possible to realize high-precision model reproducibility with respect to a shape of the three-dimensional structure.

As shown in FIG. 8, the layout simulator 40 according to the embodiment includes the display controller 42, the article positioning module 43, the texture provider 44, and the attribute adjuster 45. The display controller 42 is configured to allow the monitor device 41 to display, on the screen of the monitor device 41, a virtual space of the three-dimensional structure 30 by computer graphics based on the model information produced by the modeling device 10. The article positioning module 43 is configured to position a three-dimensional article 34 (see FIG. 9) having three-dimensional information at a desired position in the virtual space. The texture provider 44 is configured to give texture information to a face surrounded by boundary lines in the virtual space. The attribute adjuster 45 is configured to adjust an attribute containing positions of the article 34 and the texture.

The layout simulator 40 configured in this way gives the texture information to a surface of the model representing the three-dimensional structure 30, and can accordingly give a change to the appearance of the three-dimensional structure 30 in the virtual space. Renovation to the room can be reviewed based on a result simulated in the virtual space.

The aforementioned embodiment is an example of the present invention. Therefore, the invention is not limited to the embodiment, but may be examples other than the embodiment. Numerous modifications can be made in light of design and the like without departing from the true spirit and scope of the invention.

The invention claimed is:

1. A modeling device, comprising:
 a computer configured to execute a program stored in a non-transitory computer-readable storage medium or a program transmitted to the computer by a telecommunication line, the program including:
  a receiver configured to obtain, as first data, three-dimensional coordinates of each of measurement points of a three-dimensional structure having a plurality of faces from a measurement device configured to take three-dimensional measurements of the three-dimensional structure;
  a face extractor configured to produce, for each of the plurality of faces, a plane equation describing a face based on first data of each of measurement points of the face;
  a vertex extractor configured to calculate, every adjoining faces of the plurality of faces, a point that simultaneously satisfies respective plane equations describing adjoining faces to extract the point as a vertex shared among the adjoining faces; and
  a model producer configured to produce model information representing the three-dimensional structure based on each plane equation and each vertex, wherein
 the face extractor is configured
  to define, as a plane candidate, a plane described by a plane equation obtained based on coordinates of each of three measurement points of one face, and
  to determine a plane equation by recalculation based on measurement points existing in a range of a prescribed distance from the plane candidate.

2. The modeling device of claim 1, wherein:
 a room surrounded by a floor, a ceiling and walls has the three-dimensional structure;
 the face extractor is configured to produce respective plane equations describing the floor, the ceiling and the walls;
 the vertex extractor is configure to extract, every three adjoining faces of the floor, the ceiling and the walls, a vertex shared among them; and
 the model producer is configured to determine, every two adjoining faces of the floor, the ceiling and the walls, a boundary line shared therebetween.

3. The modeling device of claim 1, wherein:
 the measurement device comprises a function configured to output pixel values of images captured from the three-dimensional structure, as respective second data associated with the measurement points; and
 the face extractor comprises
  an output module configured to allow an output device to display the respective second data on a screen of the output device, and
  an input module configured to dialogically input, through an input device, information for indicating measurement points of a face in the images displayed on the output device.

4. The modeling device of claim 3, wherein:
 each second data contains color information;
 the receiver comprises a function configured to obtain each second data from the measurement device; and
 the modeling device further comprises a color extractor configured to extract each second data having color information in a preset range from each second data obtained by the receiver to display on the screen of the output device.

5. The modeling device of claim 3, wherein the vertex extractor is configured
 to dialogically input, through the input device, faces sharing a vertex with the images displayed on the screen of the output device, and
 to calculate three-dimensional coordinates of the vertex shared among the faces that are input through the input device by finding solutions of simultaneous equations as a set of plane equations.

6. The modeling device of claim 1, wherein the vertex extractor is configured to find, for each of combinations each of which includes three faces, solutions of simultaneous equations as a set of plane equations, thereby calculating three-dimensional coordinates of a vertex shared among three faces.

7. The modeling device of claim 6, further comprising a verifier configured, for each of the vertexes extracted by the vertex extractor, when no measurement points exist in at least one of faces sharing a vertex, to exclude the vertex.

8. The modeling device of claim 2, wherein:
 each first data are coordinates of a rectangular coordinate system, one coordinate axis of which is perpendicular to the floor, and
 the face extractor is configured
  to calculate an existent rate of measurement points for each of sections divided along the coordinate axis, and
  when an existent rate of a section exceeds a prescribed reference and the section satisfies conditions of the floor, to judge that measurement points included in the section correspond to the floor.

9. The modeling device of claim 8, wherein:
 the room has structure in which the ceiling is in parallel with the floor; and
 the face extractor is configured, when an existent rate of a section exceeds the prescribed reference and the section is above the section satisfying the conditions of the floor and satisfies conditions of the ceiling, to judge that measurement points included in the section correspond to the ceiling.

10. The modeling device of claim 1, further comprising:
 a dimension calculator configured to calculate, every two vertexes of a model, a distance therebetween; and
 a drawing generator configured to produce information for describing a drawing which each distance calculated by the dimension calculator with respect to the three-dimensional structure is applied to.

11. A three-dimensional model generation device, comprising:
 a measurement device configured to take three-dimensional measurements of three-dimensional structure, and
 a modeling device comprising:

a computer configured to execute a program stored in a non-transitory computer-readable storage medium or a program transmitted to the computer by a telecommunication line, the program including:
  a receiver configured to obtain, as first data, three-dimensional coordinates of each of measurement points of the three-dimensional structure having a plurality of faces from the measurement device,
  a face extractor configured to produce, for each of the plurality of faces, a plane equation describing a face based on first data of each of measurement points of the face,
  a vertex extractor configured to calculate, every adjoining faces of the plurality of faces, a point that simultaneously satisfies respective plane equations describing adjoining faces to extract the point as a vertex shared among the adjoining faces, and
  a model producer configured to produce model information representing the three-dimensional structure based on each plane equation and each vertex, wherein
the face extractor is configured
  to define, as a plane candidate, a plane described by a plane equation obtained based on coordinates of each of three measurement points of one face, and
  to determine a plane equation by recalculation based on measurement points existing in a range of a prescribed distance from the plane candidate.

12. A modeling method, comprising:
obtaining, as first data, three-dimensional coordinates of each of measurement points of a three-dimensional structure having a plurality of faces through a receiver from a measurement device configured to take three-dimensional measurements of the three-dimensional structure;
producing, using a computer, for each of the plurality of faces, a plane equation describing a face based on first data of each of measurement points of the face through a face extractor;
calculating, every adjoining faces of the plurality of faces, a point that simultaneously satisfies respective plane equations describing adjoining faces to extract the point as a vertex shared among the adjoining faces; and
producing model information representing the three-dimensional structure based on each plane equation and each vertex through a model producer, wherein
the face extractor
  defines, as a plane candidate, a plane described by a plane equation obtained based on coordinates of each of three measurement points of one face, and
  determines a plane equation by recalculation based on measurement points existing in a range of a prescribed distance from the plane candidate.

13. A non-transitory computer-readable storage medium which stores a program, the program allowing a computer to function as a modeling device, wherein the modeling device comprises:
the computer configured to execute the program, the program including:
  a receiver configured to obtain, as first data, three-dimensional coordinates of each of measurement points of a three-dimensional structure having a plurality of faces from a measurement device configured to take three-dimensional measurements of the three-dimensional structure;
  a face extractor configured to produce, for each of the plurality of faces, a plane equation describing a face based on first data of each of measurement points of the face;
  a vertex extractor configured to calculate, every adjoining faces of the plurality of faces, a point that simultaneously satisfies respective plane equations describing adjoining faces to extract the point as a vertex shared among the adjoining faces; and
  a model producer configured to produce model information representing the three-dimensional structure based on each plane equation and each vertex, wherein
the face extractor is configured
  to define, as a plane candidate, a plane described by a plane equation obtained based on coordinates of each of three measurement points of one face, and
  to determine a plane equation by recalculation based on measurement points existing in a range of a prescribed distance from the plane candidate.

14. A layout simulator, comprising:
a computer configured to execute a program stored in a non-transitory computer-readable storage medium or a program transmitted to the computer by a telecommunication line, the program including:
  a display controller configured to allow a monitor device to display, on a screen of the monitor device, a virtual space of three-dimensional structure by computer graphics based on the model information produced by the modeling device of claim 1;
  an article positioning module configured to position a three-dimensional article having three-dimensional information in a place of the virtual space;
  a texture provider configured to give texture information to a face in the virtual space; and
  an attribute adjuster configured to adjust an attribute containing positions of the article and the texture.

* * * * *